(12) United States Patent
Karhade et al.

(10) Patent No.: US 10,192,810 B2
(45) Date of Patent: Jan. 29, 2019

(54) UNDERFILL MATERIAL FLOW CONTROL FOR REDUCED DIE-TO-DIE SPACING IN SEMICONDUCTOR PACKAGES

(71) Applicant: Intel Corporation, Santa Clara, CA (US)

(72) Inventors: Omkar G. Karhade, Chandler, AZ (US); Nitin A. Deshpande, Chandler, AZ (US); Rajendra C. Dias, Phoenix, AZ (US); Edvin Cetegen, Chandler, AZ (US); Lars D. Skoglund, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 13/930,082

(22) Filed: Jun. 28, 2013

(65) Prior Publication Data

US 2015/0001717 A1 Jan. 1, 2015

(51) Int. Cl.
*H01L 23/22* (2006.01)
*H01L 23/24* (2006.01)
(Continued)

(52) U.S. Cl.
CPC .......... *H01L 23/485* (2013.01); *H01L 21/563* (2013.01); *H01L 23/49838* (2013.01);
(Continued)

(58) Field of Classification Search
CPC .... H01L 21/563; H01L 25/0655; H01L 24/17
USPC ................. 257/678, 687, 787, 789
See application file for complete search history.

(56) References Cited

U.S. PATENT DOCUMENTS

2005/0218518 A1   10/2005   Jiang et al.
2006/0226527 A1   10/2006   Hatano et al.
(Continued)

FOREIGN PATENT DOCUMENTS

EP   1418617      5/2004
JP   2008283004   11/2008
(Continued)

OTHER PUBLICATIONS

Office Action for Chinese Patent Application No. 201410298336.0, dated Jul. 25, 2016, 6 pgs.
(Continued)

*Primary Examiner* — Thao X Le
*Assistant Examiner* — Eric W Jones
(74) *Attorney, Agent, or Firm* — Schwabe, Williamson & Wyatt, P.C.

(57) ABSTRACT

Underfill material flow control for reduced die-to-die spacing in semiconductor packages and the resulting semiconductor packages are described. In an example, a semiconductor apparatus includes first and second semiconductor dies, each having a surface with an integrated circuit thereon coupled to contact pads of an uppermost metallization layer of a common semiconductor package substrate by a plurality of conductive contacts, the first and second semiconductor dies separated by a spacing. A barrier structure is disposed between the first semiconductor die and the common semiconductor package substrate and at least partially underneath the first semiconductor die. An underfill material layer is in contact with the second semiconductor die and with the barrier structure, but not in contact with the first semiconductor die.

9 Claims, 14 Drawing Sheets

(51) Int. Cl.
  *H01L 23/485* (2006.01)
  *H01L 21/56* (2006.01)
  *H01L 23/00* (2006.01)
  *H01L 23/498* (2006.01)
  *H01L 25/065* (2006.01)
  *H01L 25/18* (2006.01)

(52) U.S. Cl.
  CPC .......... *H01L 24/17* (2013.01); *H01L 25/0655* (2013.01); *H01L 25/0657* (2013.01); *H01L 25/18* (2013.01); H01L 2224/12105 (2013.01); H01L 2224/131 (2013.01); H01L 2224/13147 (2013.01); H01L 2224/16145 (2013.01); H01L 2224/16225 (2013.01); H01L 2224/1703 (2013.01); H01L 2224/17505 (2013.01); H01L 2224/26175 (2013.01); H01L 2224/2919 (2013.01); H01L 2224/32058 (2013.01); H01L 2224/32145 (2013.01); H01L 2224/32225 (2013.01); H01L 2224/73204 (2013.01); H01L 2224/81203 (2013.01); H01L 2225/06513 (2013.01); H01L 2225/06517 (2013.01); H01L 2225/06568 (2013.01); H01L 2924/12042 (2013.01); H01L 2924/15192 (2013.01); H01L 2924/15311 (2013.01); H01L 2924/181 (2013.01)

(56) References Cited

U.S. PATENT DOCUMENTS

| | | | |
|---|---|---|---|
| 2007/0201193 A1* | 8/2007 | Tsuji | 361/679 |
| 2008/0001310 A1 | 1/2008 | Sathe et al. | |
| 2008/0179738 A1* | 7/2008 | Nishimura et al. | 257/737 |
| 2009/0250810 A1 | 10/2009 | Pendse | |
| 2011/0012249 A1* | 1/2011 | Daubenspeck et al. | 257/686 |
| 2011/0275177 A1* | 11/2011 | Yim | H01L 25/0655 438/108 |
| 2012/0113608 A1 | 5/2012 | Nagar et al. | |
| 2013/0109136 A1 | 5/2013 | Foote et al. | |
| 2013/0181359 A1* | 7/2013 | Wu | H01L 25/105 257/777 |
| 2013/0277843 A1* | 10/2013 | Robbins | H05K 3/3436 257/751 |
| 2014/0061902 A1* | 3/2014 | Ramalingam et al. | 257/738 |
| 2014/0117555 A1* | 5/2014 | Liang et al. | 257/773 |
| 2015/0001729 A1* | 1/2015 | Lan | H01L 21/563 257/773 |
| 2016/0336280 A1* | 11/2016 | Lin | H01L 23/3128 |

FOREIGN PATENT DOCUMENTS

| | | |
|---|---|---|
| KR | 1020120059130 | 11/2012 |
| KR | 1020130024695 | 7/2014 |
| WO | WO 2012034064 | 3/2012 |

OTHER PUBLICATIONS

Office Action from Chinese Patent Application No. 201410298336.0, dated Dec. 22, 2017, 3 pages.

Office Action from German Patent Application No. 102014108992.8, dated Nov. 29, 2017, 11 pages.

Notice of Allowance from Korean Patent Application No. 10-2014-0079125, dated Apr. 29, 2016, 5 pages.

\* cited by examiner

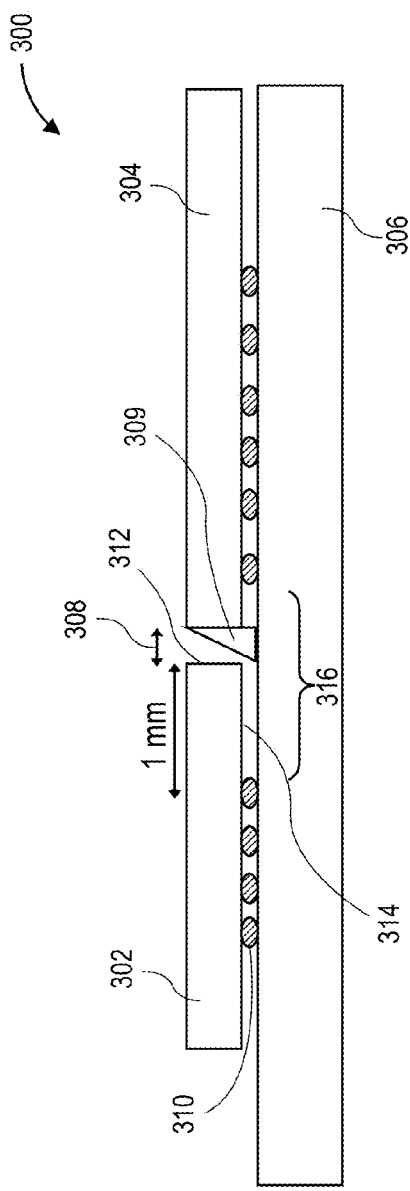
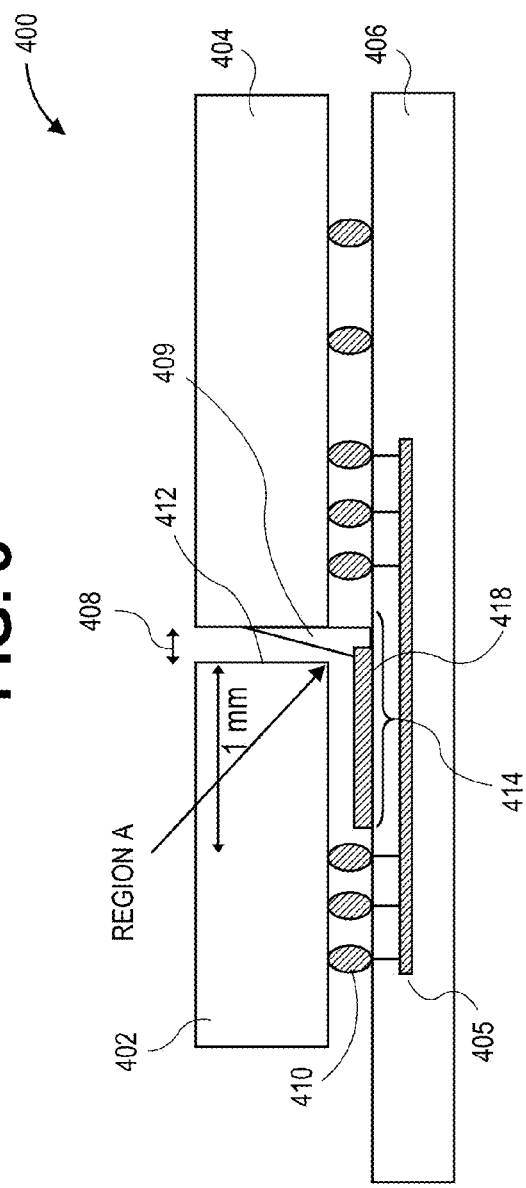

UNDERFILL MATERIAL FLOW CONTROL FOR REDUCED DIE-TO-DIE SPACING IN SEMICONDUCTOR PACKAGES

TECHNICAL FIELD

Embodiments of the invention are in the field of semiconductor packages and, in particular, underfill material flow control for reduced die-to-die spacing in semiconductor packages and the resulting semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system. However, improvements are needed in the materials used to underfill in such flip chip arrangements.

Newer packaging and die-to-die interconnect approaches, such as through silicon via (TSV) and silicon interposer, are gaining much attention from designers for the realization of high performance Multi-Chip Module (MCM) and System in Package (SiP). However, additional improvements in underfill material technologies are also needed for such newer packaging regimes.

BRIEF DESCRIPTION OF THE DRAWINGS

FIG. 3 illustrates a cross-sectional view of a semiconductor package including a memory die and a CPU/SoC die disposed on a common substrate, in accordance with an embodiment of the present invention.

FIG. 4 illustrates a cross-sectional view of a semiconductor package including a memory die and a CPU/SoC die disposed on a common substrate, in accordance with an embodiment of the present invention.

DESCRIPTION OF THE EMBODIMENTS

Underfill material flow control for reduced die-to-die spacing in semiconductor packages and the resulting semiconductor packages are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to methods and processes for control of underfill (UF) flow to reduce die-to-die (D2D) spacing in Embedded Interconnection Bridge (EmIB) based semiconductor packages and products. Aspects may include one or more of capillary underfill, EmIB based structures, silicon interposer based structures, tight die to die spacing, and general products with tight die to die distance specifications.

To provide context, Embedded Interconnection Bridge (EmIB) technology is being used and/or evaluated for high performance computing (HPC) with high bandwidth memory (HBM), examples of which are described below in association with FIGS. 1 and 2 below. In general, enabling a small (e.g., approximately 100 micron) die to die (D2D) spacing between central processing unit/system-on-chip (CPU/SoC) die and memory die has proved challenging, an example of which is described below in association with FIG. 3.

Figure 1:
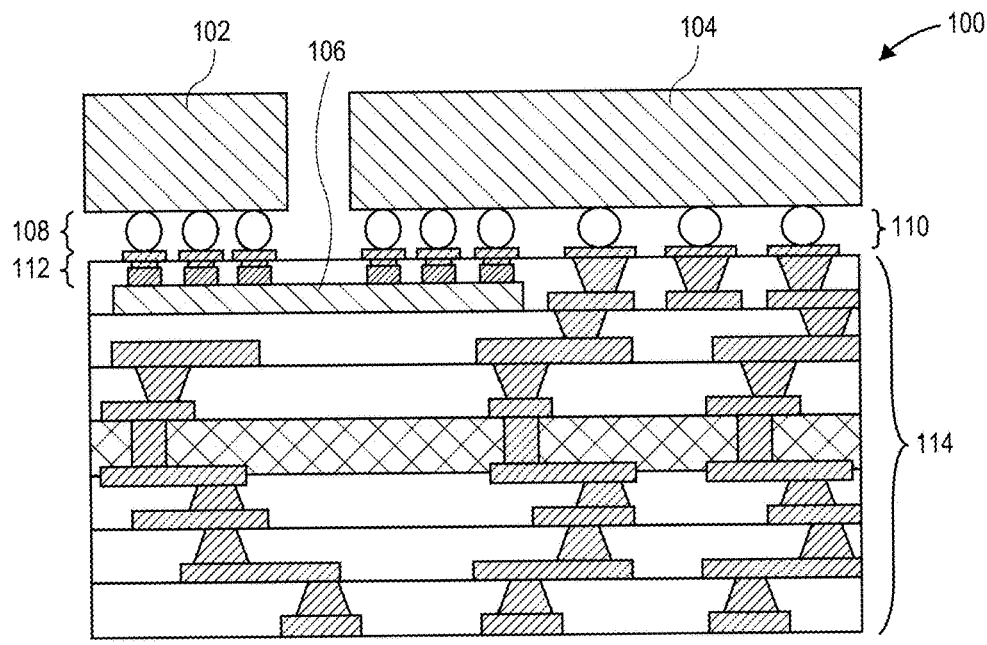
FIG. 1 illustrates a cross-sectional view of a semiconductor package having an Embedded Interconnection Bridge (EmIB) connecting Die 1 (Memory) and Die 2 (CPU/SoC), in accordance with an embodiment of the present invention.

FIG. 1 illustrates a cross-sectional view of a semiconductor package 100 having an Embedded Interconnection Bridge (EmIB) connecting Die 1 (Memory) and Die 2 (CPU/SoC), in accordance with an embodiment of the present invention. Referring to FIG. 1, the semiconductor package 100 includes a first die 102 (e.g., a memory die) and a second die 104 (e.g., a CPU or SoC die). The first die 102 and second die 104 are coupled to an EmIB 106 through bumps 108 and 110 of the first die 102 and second die 104, respectively, and bond pads 112 of the EmIB, e.g., by thermal compression bonding (TCB). The first die 102, second die 104, and EmIB 106 are included with additional routing layers 114, as depicted in FIG. 1. The additional routing layers may be simple or complex and may be for coupling to other packages or may form part or all of an organic package or printed circuit board (PCB), etc.

Figure 2:
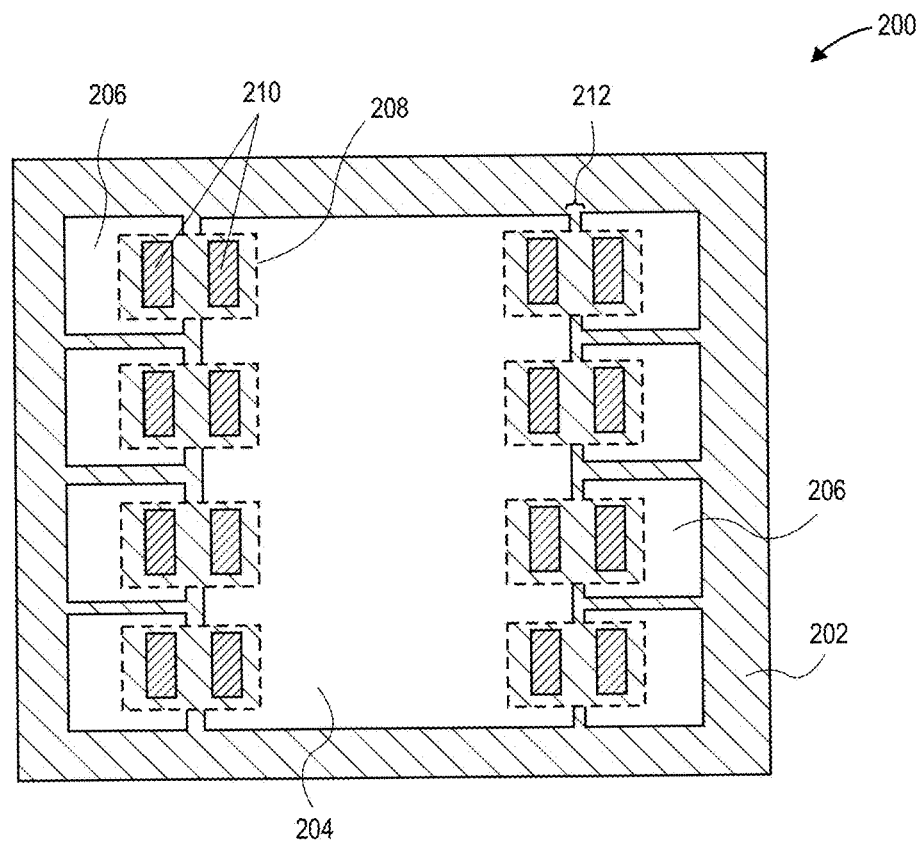
FIG. 2 illustrates a plan view of a package layout for co-packaged high performance computing (HPC) die and high bandwidth memory (HBM) layout, in accordance with an embodiment of the present invention.

FIG. 2 illustrates a plan view of a package layout 200 for co-packaged high performance computing (HPC) die and high bandwidth memory (HBM) layout, in accordance with an embodiment of the present invention. Referring to FIG. 2, the package layout 200 includes a common substrate 202. A CPU/SoC die 204 is supported by the substrate 202 along with 8 memory dies 206. A plurality of EmIBs 208 bridge the memory dies 206 to the CPU/SoC die 204 by C4 connections 210. The die-to-die spacing 212 is approximately 100-200 microns. It is to be understood that, from a top-down view perspective, the dies 204 and 206 are disposed above the C4 connections 210, which are disposed above the EmIBs 208, which are included in the substrate 202.

FIG. 3 illustrates a cross-sectional view of a semiconductor package 300 including a memory die 302 and a CPU/SoC die 304 disposed on a common substrate 306, in accordance with an embodiment of the present invention. Referring to FIG. 3, the die-to-die (D2D) spacing 308 between the memory die 302 and the CPU/SoC die 304 is approximately 100-200 microns. An underfill (UF) fillet material 309 is disposed in the gap 308. Bumps 310 of the memory die 302 are located approximately 1 millimeter from the edge 312 of the memory die 302. In accordance with an embodiment of the present invention, the resulting region 314 can be used to place a patterned barrier material, as described in greater detail below in association with FIG. 4. Additionally, slots in such barrier materials (e.g., a copper (Cu) plane) can reduce epoxy fillet width/keep out zone (KOZ) in region 316.

More specifically, with reference generally to FIGS. 1-3, high cost associated with HBM dice may require testing of the CPU die prior to memory die attachment. Current CPU underfill processes result in epoxy fillet width that can prevent memory die attachment from being less than approximately 200 microns from the CPU die. Initial evaluations involving the use of a barrier on the CPU die sidewall or dams have not been successful. Additionally, if all the dies are bonded before underfill, challenges may arise with respect to filling all of the dies without forming voids. The main risk appears to derive from merging flow fronts and also very fast edge flows along the small die to die distances.

In a general approach, in accordance with one or more embodiments of the present invention, for a given underfill (UF) epoxy material and process conditions, the UF fillet geometry (e.g., height, width and spread) can be modulated by controlling the flow of excess epoxy material with the aid of barriers (e.g., use of Cu planes) that are patterned (e.g., with slots) to channel the epoxy material and result in a short fillet width. In one such embodiment, barriers such as a copper traces or trenches are formed with different widths and lengths and their location and orientation are designed depending on the epoxy flow front otherwise observed in the absence the barrier. Such slots can be customized for different die sizes and required spacings between dies. In specific alternative embodiments, other barriers such as surface energy barriers can be rendered more effective if slots and/or trenches are fabricated along the length of the ink barrier. Substrate patterning and laser ablation are included as suitable methods for fabricating ink barrier slots.

More specifically, in accordance with one or more embodiments of the present invention, 100 to 200 micron D2D spacing is achieved by hindering the UF fillet geometry on a CPU die from interfering with placement of the memory die. The UF spread/bleed does not extend to the memory pad surfaces (e.g., for a distance of approximately 1.1 millimeters for a CPU die edge). In a particular embodiment, the region on the substrate surface between fine pitch bumps on the CPU and memory die (e.g., approx. 1.3 millimeters) is the area in which a barrier material is placed.

As an example of the above, FIG. 4 illustrates a cross-sectional view of a semiconductor package 400 including a memory die 402 and a CPU/SoC die 404 disposed on a common substrate 406, in accordance with an embodiment of the present invention. Referring to FIG. 4, an EmIB structure 405 is included in the substrate 406 and couples the memory die 402 and the CPU/SoC die 404. The die-to-die (D2D) spacing 408 between the memory die 402 and the CPU/SoC die 404 is approximately 100-200 microns. An underfill (UF) fillet material 409 is disposed in the gap 408. Fine pitch bumps 410 of the memory die 402 are located approximately 1 millimeter from the edge 412 of the memory die 402. In accordance with an embodiment of the present invention, the resulting region 414 includes a patterned barrier material layer 418 (e.g., a patterned copper layer) disposed thereon. In a specific embodiment, as described in greater detail below, slots formed in barrier material layer 418 can be used to reduce epoxy fillet width/keep out zone (KOZ), e.g., at Region A of FIG. 4. Accordingly, FIG. 4 exemplifies control of a CPU UF epoxy fillet proximity to a memory die edge. The control can be achieved by hindering the UF fillet geometry on a CPU die from interfering with placement of the memory die (e.g., at Region A).

Figure 5:
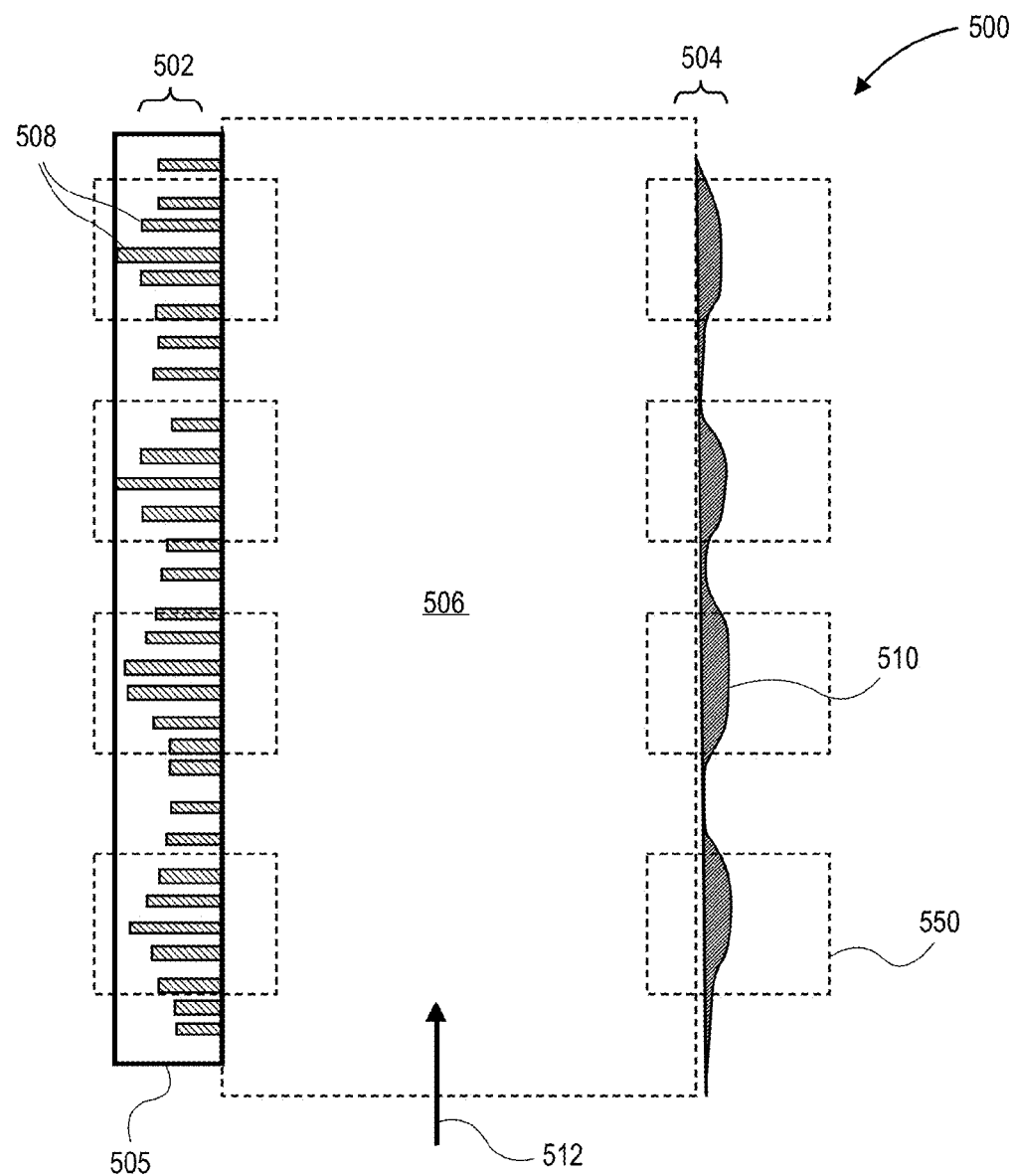
FIG. 5 is a schematic layout of copper (Cu) plane and underfill (UF) regions as separated by die-to-die (D2D) spacing, in accordance with an embodiment of the present invention.

UF epoxy flow along the edge of a CPU die is expected to be faster in the fine pitch (e.g., 55 or 65 micron) interconnect regions to the EmIB rendering the region to typically exhibit a larger fillet width. As an example, FIG. 5 is a schematic layout 500 of copper (Cu) plane 502 and underfill (UF) 504 regions as separated by die-to-die (D2D) spacing 506 (e.g., 100-200 micron), in accordance with an embodiment of the present invention. Referring to FIG. 5, the Cu plane 502 has with slots 508 formed therein and the UF flow has a pattern 510. The left side of FIG. 5 illustrates placement of the barrier material (e.g., the Cu plane). The Cu plane 502 extends between two adjacent die, e.g., along the whole length of a CPU die 505 and, possibly, also under part of an adjacent memory die.

It is to be understood that slot length and width can be adjusted to minimize the height and width of the epoxy fillet, as shown in FIG. 5. Also, patterns other than slots may be formed in the barrier (e.g., copper plane) material. Such slots or patterns cut in copper or other barrier materials can enable control of UF spread and/or fillet shape or height in different regions along a die edge. The slots or patterns are, in one embodiment, fabricated using laser ablation to reduce an underfill keep out zone (KOZ). It is to be understood that the slots or patterns can be fabricated to have differing shapes, sizes and/or orientations, depending on the specific application.

In an embodiment, the edge of the copper plane 502 acts as a barrier to the UF epoxy and, in addition, slots can be made in the copper plane to "bleed out" any excess epoxy material that extends outside the die region. Referring again to FIG. 5, the UF dispense direction is shown by arrow 512. In a particular embodiment, the UF flows more at fine pitch interconnect regions at EmIB 550, as depicted in FIG. 5.

Figure 6:
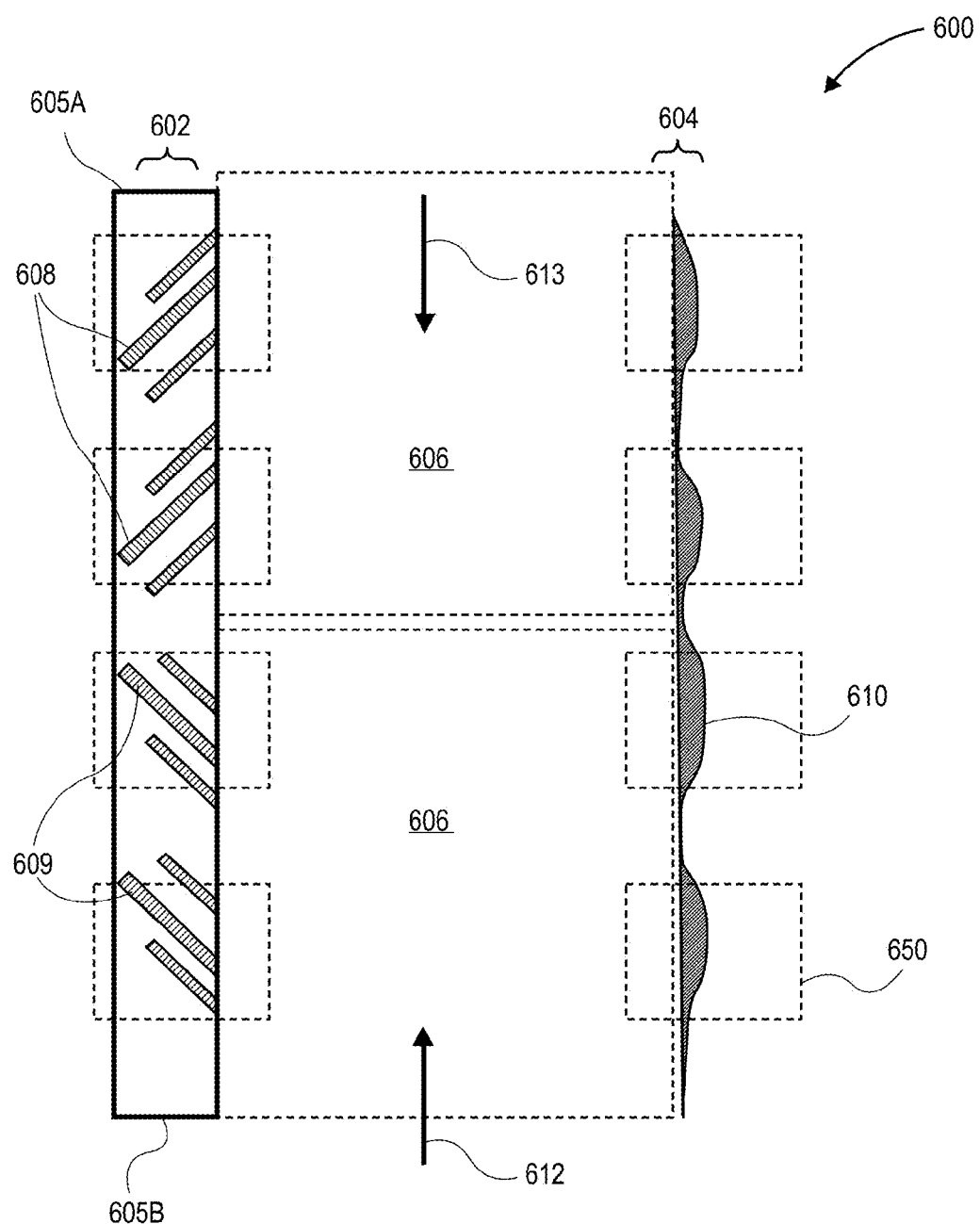
FIG. 6 is a schematic layout of copper (Cu) plane and underfill (UF) regions as separated by die-to-die (D2D) spacings, in accordance with an embodiment of the present invention.

In another aspect, in the case of where two CPU die are disposed above a common substrate, slots in a barrier material may be formed in a chevron pattern and orientation dependent on the direction of UF dispense flow. As an example, FIG. 6 is a schematic layout 600 of copper (Cu) plane 602 and underfill (UF) 604 regions as separated by die-to-die (D2D) spacings 606 (e.g., 100-200 micron), in accordance with an embodiment of the present invention. Referring to FIG. 6, the Cu plane 602 has a first plurality of slots 608 having a first orientation and a second plurality of slots 609 having a second, different, orientation formed therein. The UF flow has a pattern 610. The left side of FIG. 6 illustrates placement of the barrier material (e.g., the Cu plane). The Cu plane 602 is shared by two CPU die, 605A and 605B and, possibly, also under part of an adjacent memory die. The UF dispense directions are shown by arrows 612 and 613. In a particular embodiment, the UF flows more at fine pitch interconnect regions at EmIB 650, as depicted in FIG. 6. In a particular embodiment, as depicted, chevron slots (608 and 609) are made in the Cu plane and oriented in the respective direction 612 or 613 of UF epoxy flow.

Referring again to FIGS. 5 and 6, slots such as slots 508, 608 and 609, or other geometric patterns, can be formed in a copper plane using an ultra-violet (UV) laser ablation process that does not damage an underlying dielectric material. In an exemplary embodiment, a suitable laser parameter set includes the use of pulsed wave UV laser ablation at a laser wavelength of approximately 355 nanometers, a power of approximately 18 mJ, a frequency (e.g., repetition rate) of approximately 32 kHz, a Galvonic speed of approximately 210 mm/s, a spot size of approximately 8 microns, a beam expansion of approximately 10× (e.g., for a beam diameter of approximately 40 microns. In one embodiment, performing the laser ablations involves importing a DXF file of the slot pattern to the laser system, and the galvo directs the laser beam to ablate copper only at the slot regions.

Figure 7:
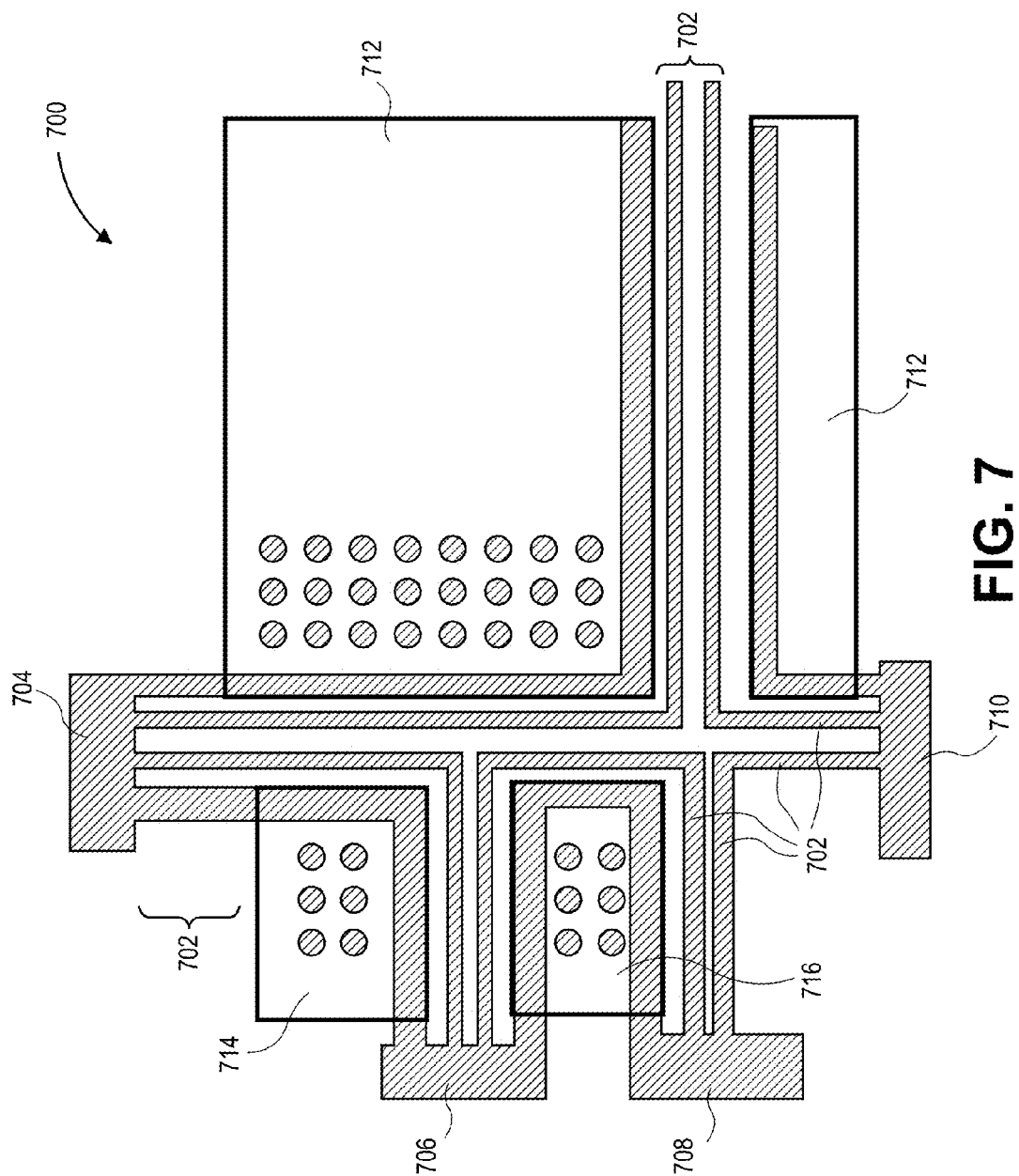
FIG. 7 illustrates an exemplary plan view of a layout for copper traces between dies for small fillets, in accordance with an embodiment of the present invention.

FIG. 7 illustrates an exemplary plan view of a layout 700 for copper traces between dies for small fillets, in accordance with an embodiment of the present invention. Referring to FIG. 7, a plurality of copper traces 702 is coupled with one or more pad 704, 706, 708, 710 provided to avoid lifting. A CPU die 712, a first memory die 714, and a second memory die 716 overly the layout 700. The layout depicted can enable a two-pass process flow where the CPU is underfilled prior to bonding of the memory dies. In another embodiment, the layout also enables a process flow where all the dies are bonded before underfilling, so long as each of the dies has at least 1 side where free form a neighboring die to allow for dispensing of UF material.

Figure 8:
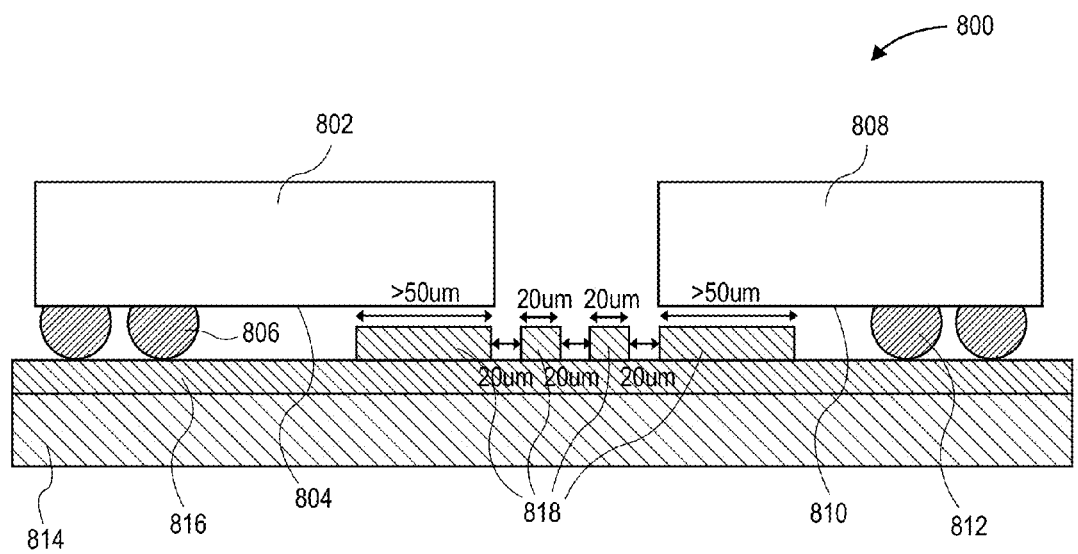
FIG. 8 illustrates a representative cross-sectional view of a portion of the layout of copper traces of FIG. 7, in accordance with an embodiment of the present invention.

FIG. 8 illustrates a representative cross-sectional view of a portion of the layout of copper traces of FIG. 7, in accordance with an embodiment of the present invention. Referring to FIG. 8, a semiconductor package 800 includes a first die 802 having a first overhang 804 adjacent bumps 806 and includes a second die 808 having a second overhang 810 adjacent bumps 812. The first and second die are disposed above a package substrate 814 and intervening dielectric layer 816. In one embodiment, the dielectric layer 816 is an Aginomoto build up film (ABF) dielectric layer. Copper traces 818 are disposed on the dielectric layer 816, between dies 802 and 808. In one embodiment, as depicted, the features of the copper traces 818 have a spacing of approximately 20 microns. Narrower feature widths are approximately 20 microns, while wider feature widths are approximately 50 microns, as depicted. In one embodiment, the stepping die size is approximately 25 microns larger than the actual die size on each side. It is to be understood that the trenches between traces can be made of different widths, heights and/or spacings.

Figure 9:
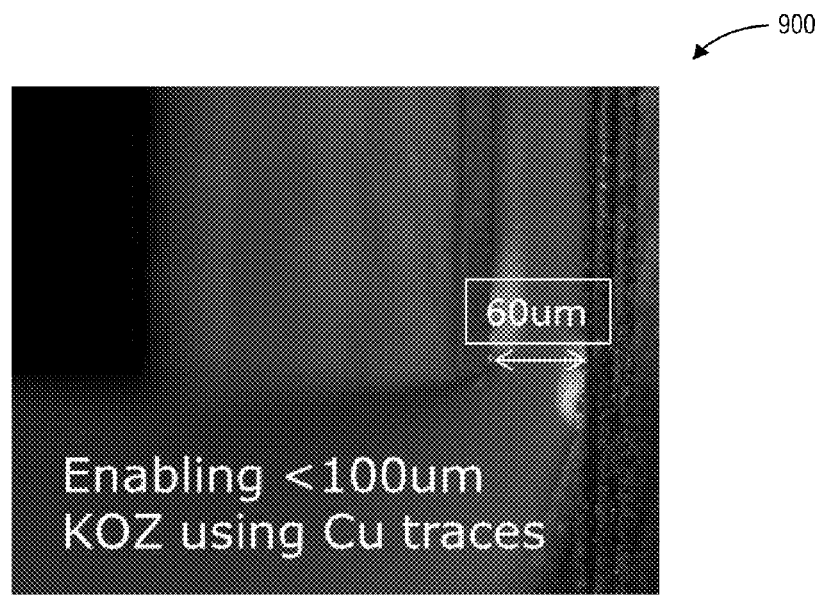
FIG. 9 is an image illustrating the use of copper traces/trenches to limit epoxy fillet, in accordance with an embodiment of the present invention.

FIG. 9 is an image 900 illustrating the use of copper traces/trenches to limit epoxy fillet, in accordance with an embodiment of the present invention. Referring to image 900, the epoxy fillet is limited to approximately 60 microns. The extent of the limiting is sufficient to enable 100 micron die-to-die distance. That is a keep out zone (KOZ) of less than 100 microns is achieved using copper (Cu) traces.

Figure 10:
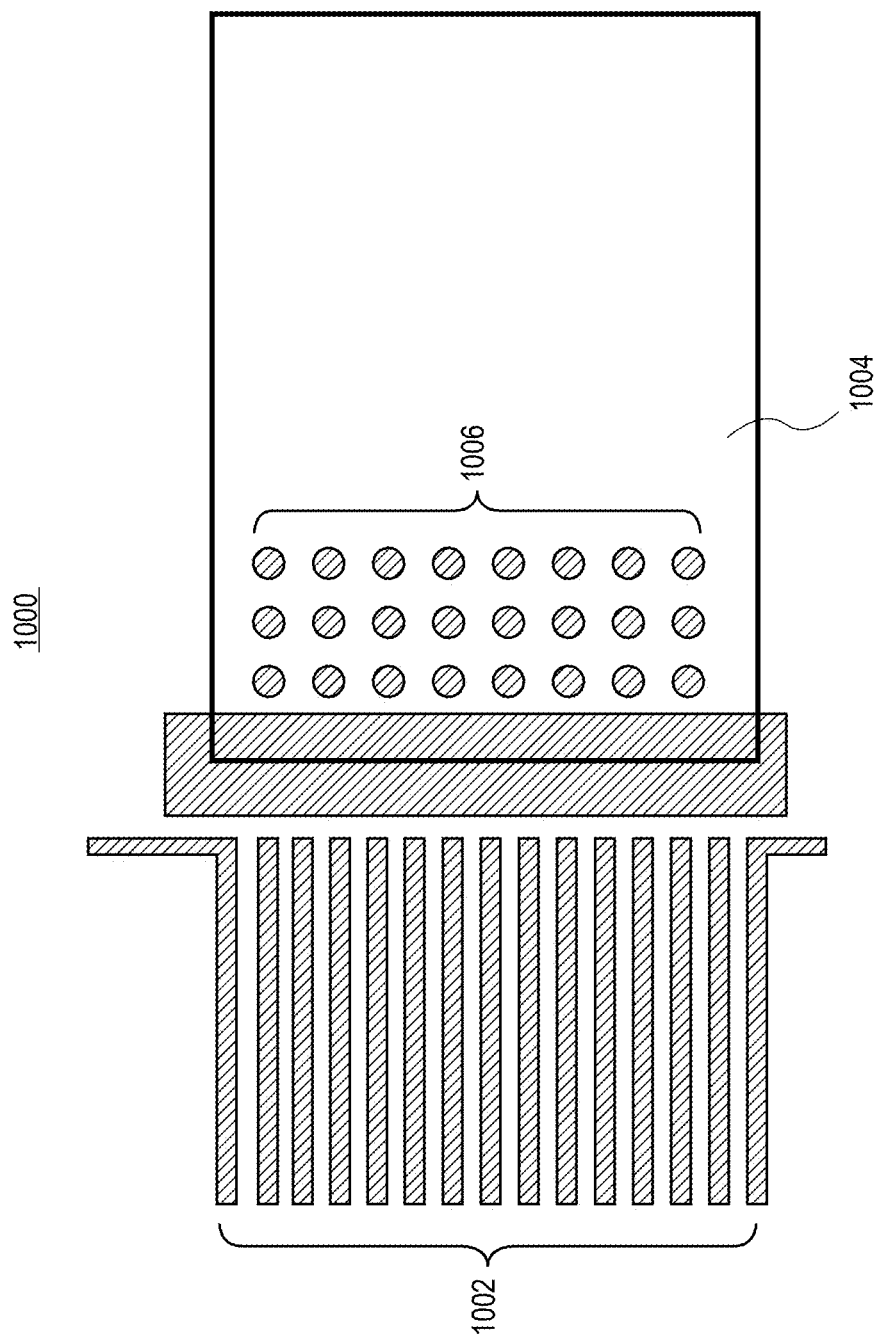
FIG. 10 illustrates a plan view of a layout of copper traces/trenches for use as runaway routes for excess epoxy, in accordance with an embodiment of the present invention.

FIG. 10 illustrates a plan view of a layout 1000 of copper traces/trenches for use as runaway routes for excess epoxy, in accordance with an embodiment of the present invention. Referring to FIG. 10, the layout 1000 includes a plurality of copper traces 1002 (note that the traces can alternatively be viewed as trenches formed in copper). The copper traces 1002 provide runaway routes for excess epoxy when dispensed on the die 1004 located on the right side of the layout 1000. In one embodiment, the spacing between the traces 1002 is determined such that the capillary pressure (pull) is higher than the die bump area 1006. This results in excess epoxy being sucked by the runaway traces, away from the die edge, keeping the fillet small. Referring back to FIG. 7, such traces are implemented between dies.

Figure 11:
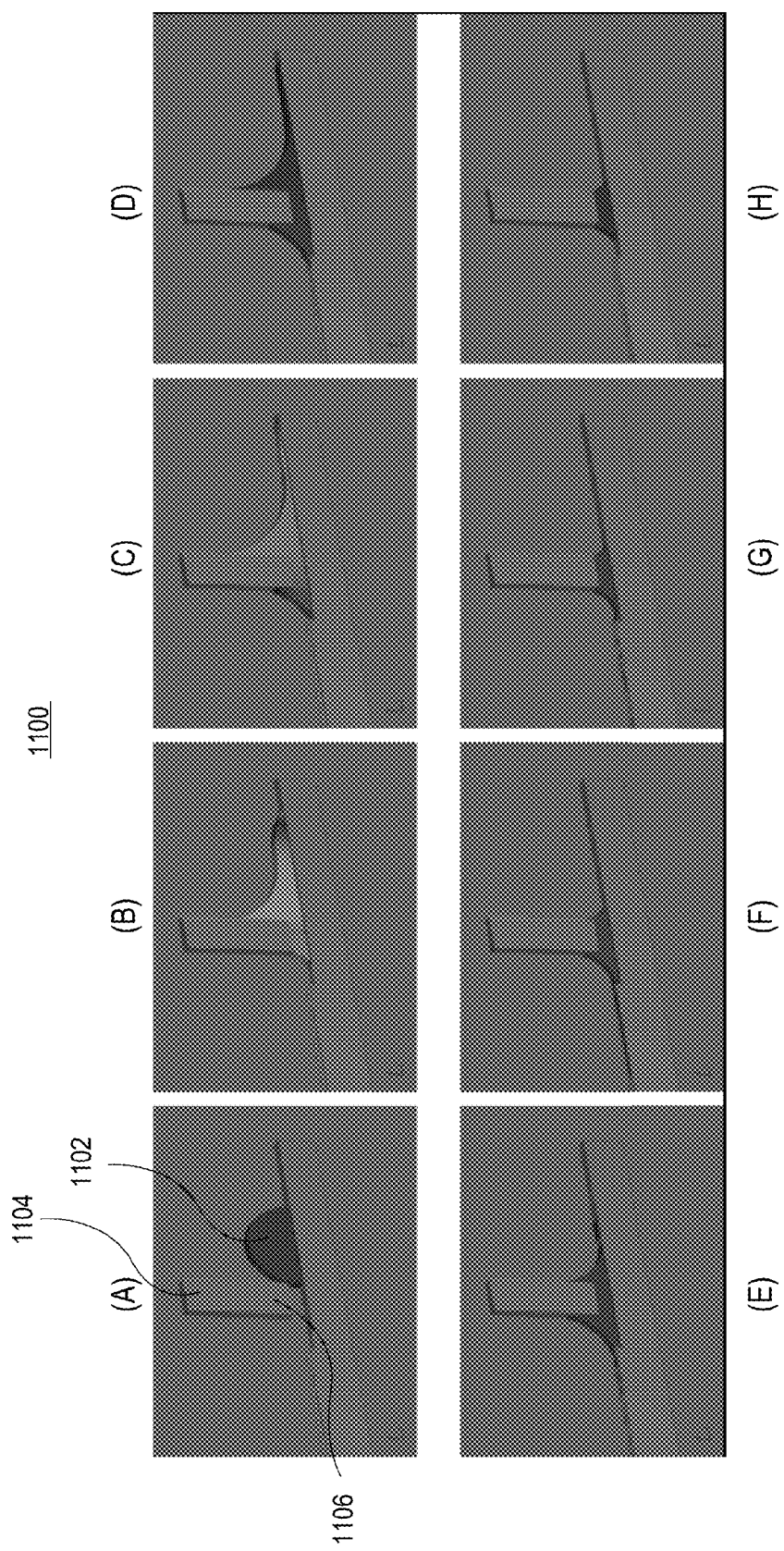
FIG. 11 includes a plurality of simulation images from simulation results demonstrating a runaway trench concept, in accordance with an embodiment of the present invention.

FIG. 11 includes a plurality of simulation images 1100 from simulation results demonstrating a runaway trench concept, in accordance with an embodiment of the present invention. Referring to the simulation images 1100, at (A), an epoxy 1102 is dispensed on the right side of a die 1104. Following images (A)-(H), the epoxy 1102 is pulled under a C4 area 1106 of the die 1104. As the fillet grows, it touches the trench on the left side. The trench continues to pull the excess epoxy with higher capillary force until the fillet is broken on the left side. This leaves the fillet width smaller than the distance between die and trenches.

In another embodiment, instead of copper, an ink barrier is used. In one such embodiment, patterns formed by the ink barrier are greater than approximately 150 microns wide. By contrast, features at or less than 150 microns in width may be breached during an epoxy flow process. In one embodiment, in a wider ink barrier (e.g., feature width greater than 150 microns) is used together with slots formed in a metal barrier material (e.g., in a copper barrier layer) to provide for additional containment of an epoxy flow. In another embodiment, slots are patterned with relatively wider cavities in regions where the epoxy flow is greater (e.g., regions where there are fine pitch interconnections).

Figure 12:
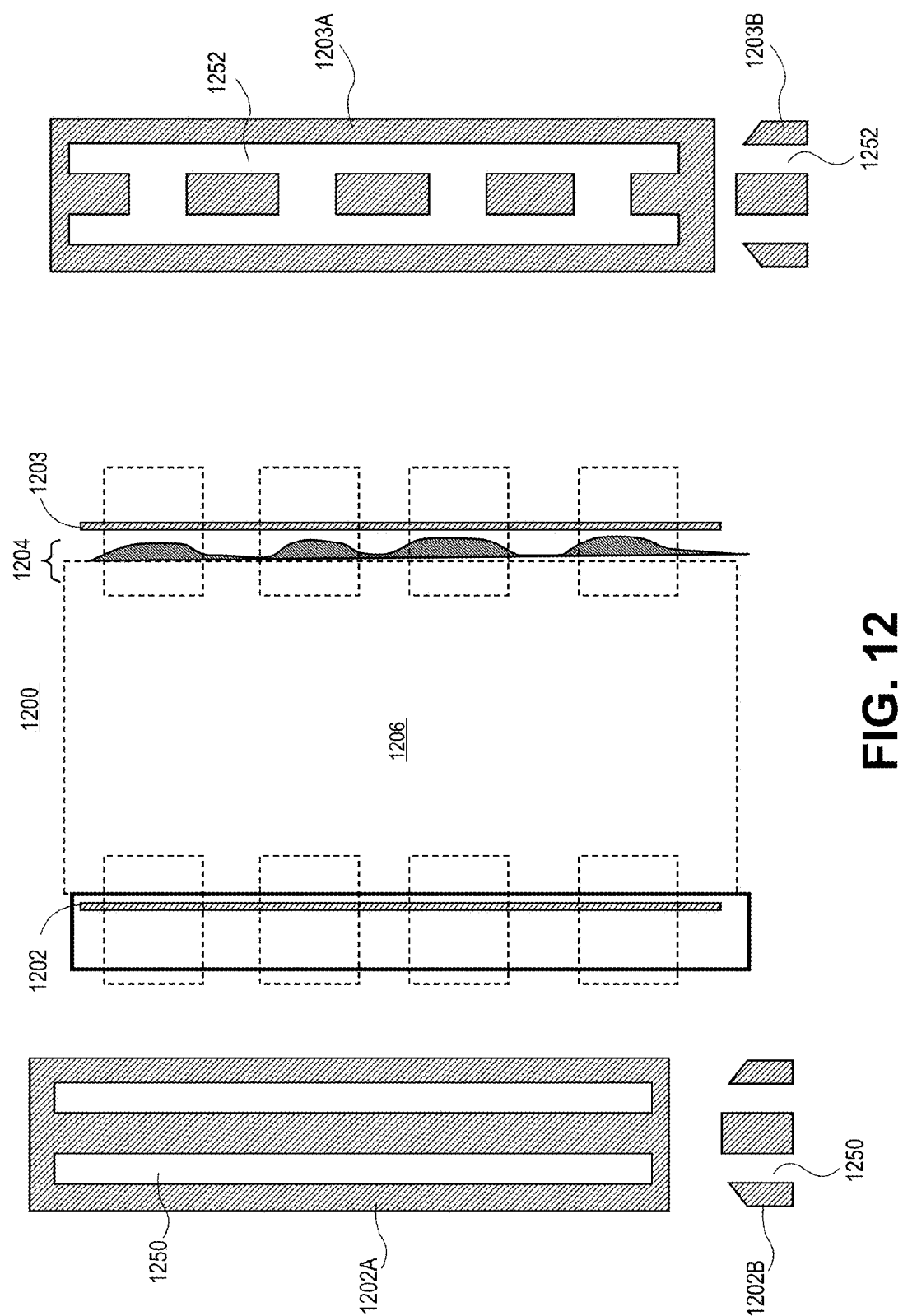
FIG. 12 includes a schematic layout of an ink barrier and underfill (UF) regions as separated by die-to-die (D2D) spacing, in accordance with an embodiment of the present invention.

As an example of an implementation using an ink barrier, FIG. 12 includes a schematic layout 1200 of an ink barrier 1202 and underfill (UF) 1204 regions as separated by die-to-die (D2D) spacing 1206 (e.g., 100-200 micron), in accordance with an embodiment of the present invention. The UF material 1204 may bleed to a greater extent at fine bump structures, as shown in FIG. 12. A second ink barrier 1203 is also included on the same side of the spacing 1206 as the UF 1204. Also included in FIG. 12 are magnified views of ink barrier 1202 (as plan view 1202A and cross-sectional view 1202B) and of ink barrier 1203 (as plan view 1203A and cross-sectional view 1203B). As viewed from the magnified views, in an embodiment, slots 1250 and 1252 may be included in the ink barriers 1202 and 1203, respectively. In one such embodiment, slots or patterns in the ink barriers 1202 and 1203 are cut into the ink in order to contain any UF material that breaks the ink barrier height. In a specific embodiment, as depicted in FIG. 12, slots located on the left-hand side of layout 1200 and connected slots on the right-hand side of layout 1200 aid in flow of excess UF material and reduction in fillet width.

Embodiments described herein may have far reaching implementations for, e.g., reliability improvement. Applications may include, but need not be limited to, CPUs/processors, multi-chip/3D packaging including CPU in combination with other devices, memory (e.g., flash/DRAM/SRAM, etc. Several non-limiting examples are provided below. Implementations include applications in high performance microprocessor (e.g., server) packages, multi-chip packages, organic package substrates, transmission lines, 2.5 D (Si feature between die and board), on-die, on package, etc. architectures. More generally, embodiments described herein may have far reaching implementations for CPUs/processors, multi-chip/3D packaging including CPU in combination with other devices, memory (e.g., flash/DRAM/SRAM, etc. Several non-limiting examples are provided below. Application may be particularly useful for flip chip, controlled collapse chip connection (C4) and/or ball grid array (BGA) implementations.

In a first general example, an example of which is illustrated in FIG. 4, in accordance with an embodiment of the present invention, a dies are coupled to a flexible substrate or a rigid substrate, depending upon the specific application. The substrate has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA). Regions 414 for inclusion of barriers 418 for controlling underfill material flow are provided in the package substrate.

Figure 13A:
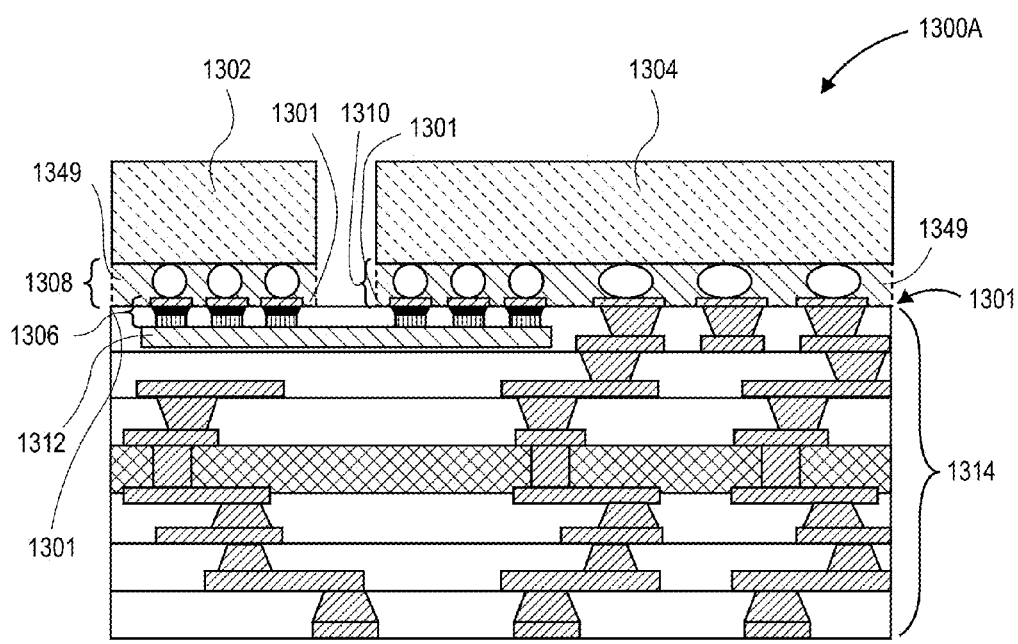
FIG. 13A illustrates a cross-sectional view of a semiconductor package including multiple die coupled with an embedded interconnect bridge (EmIB) and including barriers for controlling underfill material flow, in accordance with an embodiment of the present invention.

In another example implementation, FIG. 13A illustrates a cross-sectional view of a semiconductor package 1300A including multiple die coupled with an EmIB and each die including barriers for controlling underfill material flow, in accordance with another embodiment of the present invention. Referring to FIG. 13A, the semiconductor package 1300A includes a first die 1302 (such as a CPU, memory chipset, etc.) and a second die 1304 (such as a CPU, memory chipset, etc.). The first die 1302 and second die 1304 are coupled to an EmIB 1306 through bumps 1308 and 1310 of the first die 1302 and second die 1304, respectively, and bond pads 1312 of the silicon bridge, e.g., by thermal compression bonding (TCB). The first die 1302, second die 1304, and EmIB 1306 are included with additional routing layers 1314, as depicted in FIG. 13A. The additional routing layers may be simple or complex and may be for coupling to other packages or may form part or all of an organic package or printed circuit board (PCB), etc. An epoxy-fillet material 1349 is included between the first die 1302 and the EmIB 1312/structure 1314 interface and between the second die 1304 and the EmIB 1312/structure 1314 interface. In one embodiment, regions 1301 for inclusion of barriers for controlling underfill material flow are provided in the structure 1314. In another embodiment, a silicon bridge is used and is not embedded in the package, but rather in an open cavity.

Figure 13B:
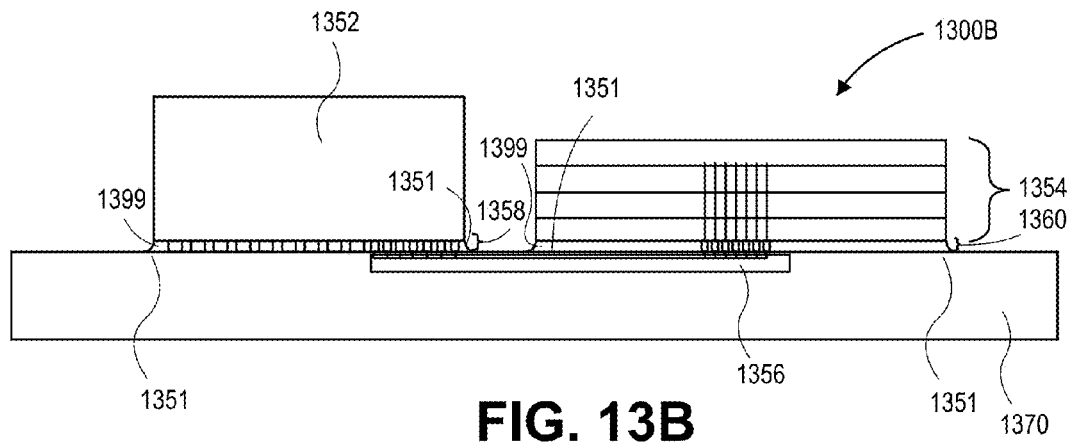
FIG. 13B illustrates a cross-sectional view of a semiconductor package including multiple die coupled with an embedded interconnect bridge (EmIB) and including barriers for controlling underfill material flow, in accordance with an embodiment of the present invention.

In another example implementation, FIG. 13B illustrates a cross-sectional view of a semiconductor package 400B including multiple die/die stack coupled with an embedded interconnect bridge (EmIB) and each die/die stack including barriers for controlling underfill material flow, in accordance with an embodiment of the present invention. Referring to FIG. 13B, the semiconductor package 1300B includes a first die 1352 (such as a central processing unit, CPU) and a second die 1354 (such as an additional CPU or a memory die or memory die stack, the memory die stack depicted in FIG. 13B). The first die 1352 and second die 1354 are coupled to an EmIB 1356 through bumps 1358 and 1360 of the first die 1352 and second die 1354, respectively, e.g., by thermal compression bonding (TCB). The EmIB 1356 is embedded in a substrate (e.g., flexible organic substrate) or board (such as epoxy PCB material) material 1370, as depicted in FIG. 13B. An epoxy fillet material 1399 is included between the first die 1352 and the EmIB 1356/substrate 1370 interface and between the second die 1354 and the EmIB 1356/substrate 1370 interface. In one embodiment, regions 1351 for inclusion of barriers for controlling underfill material flow are provided in the substrate 1370.

Figure 14:
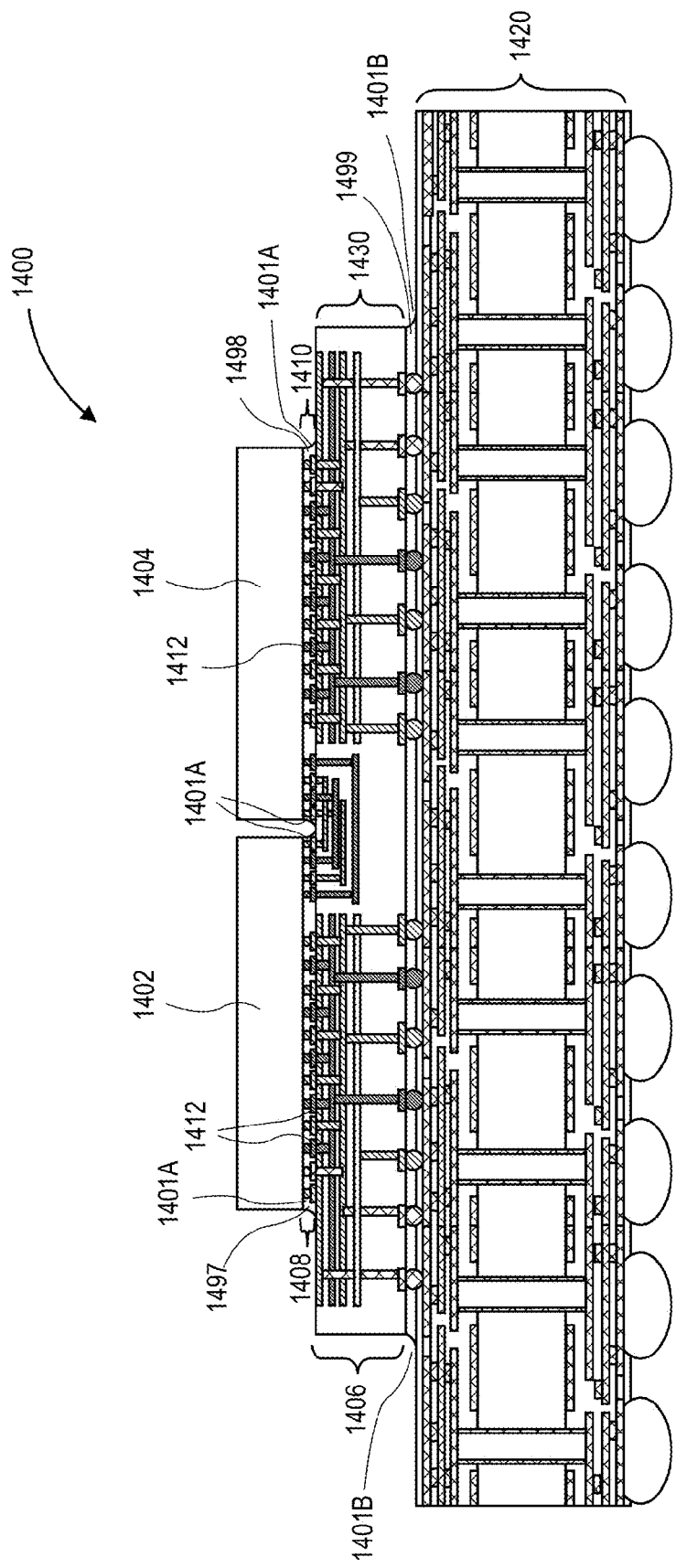
FIG. 14 illustrates a cross-sectional view of a semiconductor package including multiple die coupled with an interposer and including barriers for controlling underfill material flow, in accordance with an embodiment of the present invention.

Embodiments of the present invention may also be applicable for an interposer structure, either at an interposer/substrate interface, or at die/interposer interfaces, or both. For example, FIG. 14 illustrates a cross-sectional view of a semiconductor package 1400 including multiple die coupled with an interposer and including barriers for controlling underfill material flow, in accordance with an embodiment of the present invention. Referring to FIG. 14, the semiconductor package 1400 includes a first die 1402 and a second die 1404. The first die 1402 and second die 1404 are coupled to an interposer 1406, such as a silicon interposer. The first die 1402 and second die 1404 are coupled to the interposer 1406 through bumps 1408 and 1410 of the first die 1402 and second die 1404, respectively, and bond pads 1412 of the interposer 1406, e.g., by thermal compression bonding (TCB). The interposer 1406 couples the first die 1402 and second die 1404 with an organic package 1420. The organic package 1420 may include its own routing layers, as depicted in FIG. 14. Coupling through interposer 1406 may be achieved by use of through silicon vias (TSVs) 1430, as is also depicted in FIG. 14. In an embodiment, as depicted, possible locations for including an underfill material 1497, 1498 or 1498 include between the first die 1402 and interposer 1406, between the second die 1404 and interposer 1406, and between the interposer 1406 and package 1420. In one embodiment, regions 1401A for inclusion of barriers for controlling underfill material flow between a die and interposer are provided in the interposer 1406. In one embodiment, regions 1401B for inclusion of barriers for controlling underfill material flow between an interposer and substrate are provided in the organic package 1420.

In another aspect, various 3D integrated circuit packages with through-mold first level interconnects and including an epoxy fillet material are described, in accordance with embodiments of the present invention.

Figure 15:
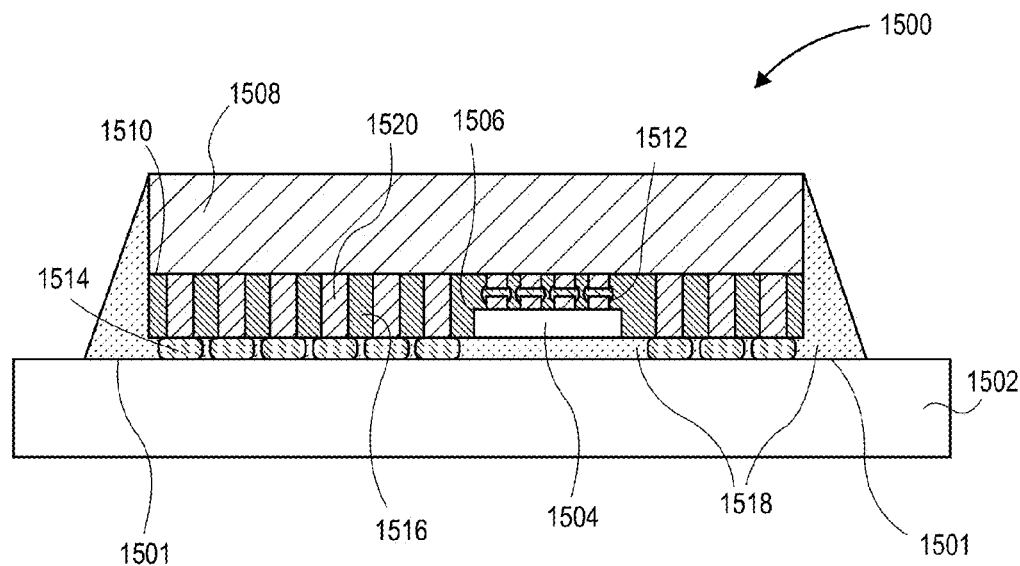
FIG. 15 illustrates a cross-sectional view of a 3D integrated circuit package with through-mold first level interconnects and including barriers for controlling underfill material flow, in accordance with an embodiment of the present invention.

In a first example, referring to FIG. 15, a semiconductor package 1500 includes a substrate 1502. A bottom semiconductor die 1504 has an active side 1506 with a surface area. The bottom semiconductor die 1504 is coupled to the substrate 1502 with the active side 1506 distal from the substrate 1502. A top semiconductor die 1508 has an active side 1510 with a surface area larger than the surface area of the bottom semiconductor die 1504. The top semiconductor die 1508 is coupled to the substrate 1502 with the active side 1510 proximate to the substrate 1502. The active side 1506 of the bottom semiconductor die 1504 is facing and conductively coupled to the active side 1510 of the top semiconductor die 1508 by die to die interconnect structures 1512 (e.g., composed of soldered bumps from each of the die). The top semiconductor die 1508 is conductively coupled to the substrate 1502 by first level interconnects 1514 that bypass the bottom semiconductor die 1504. The top semiconductor die 1508 is further conductively coupled to the substrate 1502 by a plurality of bumps 1520 (e.g., tall copper bumps) that extend from the active side 1510 of the top semiconductor die 1508 and adjacent to the bottom semiconductor die 1504. The plurality of bumps 1520 is coupled to the first level interconnects 1514. In an embodiment, the bottom semiconductor die 1504 and the plurality of bumps 1520 are housed in a molding layer 1516, as depicted in FIG. 15. In an embodiment, the top semiconductor die 1508 and the bottom semiconductor die 1504 are further coupled to the substrate 1502 by an epoxy fillet material 1518, as is also depicted in FIG. 15. In one embodiment, regions 1501 for inclusion barriers for controlling underfill material flow are provided in the substrate 1502.

In an embodiment, the top semiconductor die 1508 is configured to provide power to the bottom semiconductor die 1504. In an embodiment, the top semiconductor die 1508 is configured to facilitate communication between the bottom semiconductor die 1504 and the substrate 1504, e.g., through routing in the substrate 1508. In an embodiment, the bottom semiconductor die 1504 has no through silicon vias (TSVs). Thus, connection between the bottom die 1504 and substrate 1502 is achieved indirectly through interconnect lines on the top die 1508 as well as the FLI bumps 1514. It is to be understood, however, that, in an alternative embodiment, a bottom die may be connected directly by using TSV on the bottom die.

Thus, in reference to FIG. 15, for a 3D IC with through-mold FLI, bottom and top active die are stacked face-to-face. No TSV may be necessary to achieve such 3D IC stacking FLI copper bumps are embedded in a molding layer. The top and bottom die have a common interface underfilled by the molding compound. Fabrication-wise, the final 3D IC stacked die with through mold first level interconnect (FLI) is attached to a package substrate, underfilled, and subsequently assembled.

One or both of the semiconductor die 1504 or 1508 may be formed from a semiconductor substrate, such as a single crystalline silicon substrate. Other materials, such as, but not limited to, group III-V material and germanium or silicon germanium material substrates may also be considered. The active side (1506 or 1510, respectively) of the semiconductor die 1504 or 1508 may be the side upon which semiconductor devices are formed. In an embodiment, the active side 1506 or 1510 of the semiconductor die 1504 or 1508, respectively, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

Stacked die apparatus 1500 may be particularly suitable for packaging a memory die with a logic die. For example, in an embodiment, one of die 1504 or 1508 is a memory die. The other die is a logic die. In an embodiment of the present invention, the memory die is a memory device, such as but not limited to a static random access memory (SRAM), a dynamic access memory (DRAM), a nonvolatile memory (NVM) and the logic die is a logic device, such as but not limited to a microprocessor and a digital signal processor.

In accordance with an embodiment of the present invention, one or more of die interconnect structures 1512, plurality of bumps 1520, or first level interconnects 1514 is composed of an array of metal bumps. In one embodiment, each metal bump is composed of a metal such as, but not limited to, copper, gold, or nickel. Substrate 1502 may be a flexible substrate or a rigid substrate, depending upon the specific application. In an embodiment, substrate 1502 has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA).

With respect to molding layer 1516, several options may be used to fabricate the layer. In an embodiment, an FLI bump and bottom-die over-mold approach is used. In one embodiment, the over-mold layer is subsequently grinded back to expose the FLI bumps. In one embodiment, grind back is performed close to the bump (e.g., copper bump) and then laser ablation is used to open the copper bumps. Subsequently, solder paste print or micro-ball attach is performed onto the copper bumps. In one embodiment, directly laser open of the copper bumps is performed without any grind back. A solder operation may similarly be performed as above. In another embodiment, bump and bottom die molding are exposed with a polymer film above the FLI bumps and bottom die. No bump exposure is needed; however, cleaning of the FLI Cu bump may be needed by plasma, or laser, etc. In another embodiment, transfer or compression mold is used. In another embodiment, capillary underfill layer formation is extended to cover the FLI bumps in instead of conventional molding. The molding layer 1516 may be composed of a non-conductive material. In one embodiment, the molding layer 1516 is composed of a material such as, but not limited to, a plastic or an epoxy resin composed of silica fillers.

Figure 16:
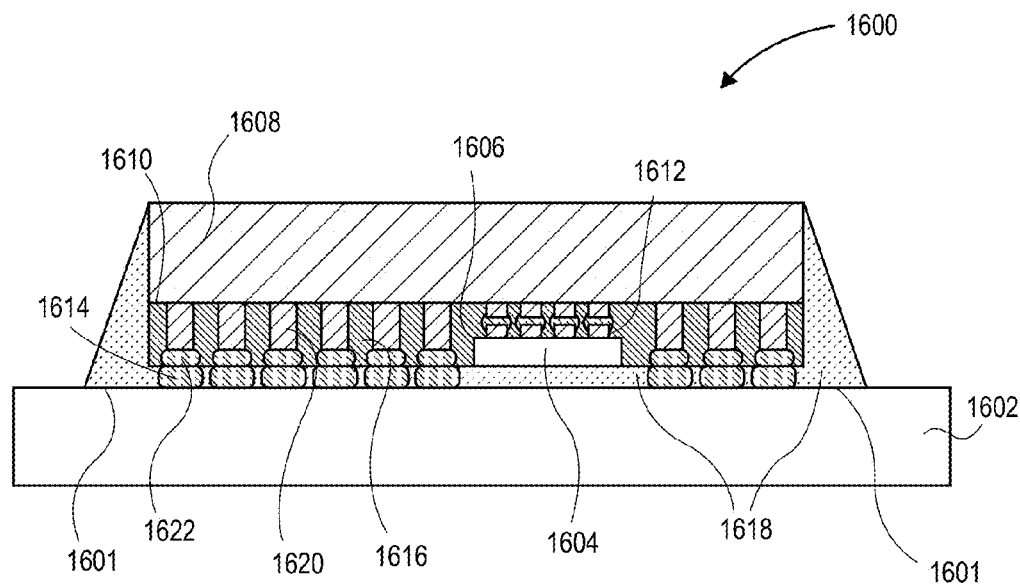
FIG. 16 illustrates a cross-sectional view of a 3D integrated circuit package with through-mold first level interconnects and including barriers for controlling underfill material flow, in accordance with an embodiment of the present invention.

In a second example, referring to FIG. 16, a semiconductor package 1600 includes a substrate 1602. A bottom semiconductor die 1604 has an active side 1606 with a surface area. The bottom semiconductor die 1604 is coupled to the substrate 1602 with the active side 1606 distal from the substrate 1602. A top semiconductor die 1608 has an active side 1610 with a surface area larger than the surface area of the bottom semiconductor die 1604. The top semiconductor die 1608 is coupled to the substrate 1602 with the active side 1610 proximate to the substrate 1602. The active side 1606 of the bottom semiconductor die 1604 is facing and conductively coupled to the active side 1610 of the top semiconductor die 1608 by die to die interconnect structures 1612. The top semiconductor die 1608 is conductively coupled to the substrate 1602 by first level interconnects 1614 that bypass the bottom semiconductor die 1604. The top semiconductor die 1608 is further conductively coupled to the substrate 1602 by a plurality of bumps 1620 that extend from the active side 1610 of the top semiconductor die 1608, and at least partially adjacent to the bottom semiconductor die 1604, to a plurality of solder balls 1622. The plurality of solder balls 1622 is coupled to the first level interconnects 1614. In an embodiment, the bottom semiconductor die 1604, the plurality of bumps 1620, and the plurality of solder balls 1622 are housed in a molding layer 1616, as depicted in FIG. 16. In an embodiment, the top semiconductor die 1608 and the bottom semiconductor die 1604 are further coupled to the substrate 1602 by an epoxy fillet material 1618, as is also depicted in FIG. 16. In one embodiment, regions 1601 for inclusion of barriers for controlling underfill material flow are provided in the substrate 1602.

Thus, in reference to FIG. 16, another approach for a 3D IC with through-mold FLI includes disposing solder inside a molding layer. The solder may be placed before molding and then exposed by grind back or laser open. Alternatively, solder paste may be placed after laser opening through copper bumps. The characteristics and configurations of the packaged die and the materials of package 1600 may be the same or similar to those described above for package 1500. In an embodiment, the solder balls 1622 are composed of lead or are lead free, such as alloys of gold and tin solder or silver and tin solder.

In reference to FIGS. 15 and 16, mixed FLI bump heights may be used for a top semiconductor die. For example, in one embodiment, a mixed height FLI bump is created by using a top-hat or a slender copper column bumping process. Here, the first bumping mask and plating operation provides short bump heights for both FLI and LMI. The second bumping mask and plating operation provides only the FLI bumps as taller. It is to be understood that various combinations of copper and solder bumping may be performed for FLI, as shown FIGS. 15 and 16.

In another aspect of the present invention, coreless substrates with embedded stacked through-silicon via die are disclosed. For example, a semiconductor die with C4 solder ball connections may be packaged in a Bumpless Build-Up Layer or BBUL processor packaging technology. Such a process is bumpless since it does not use the usual tiny solder bumps to attach the silicon die to the processor package wires. It has build-up layers since it is grown or built-up around the silicon die. Additionally, some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA). In a specific example involving stacked die, FIG. 17 illustrates a cross-sectional view of a coreless substrate with an embedded stacked through-silicon via die and including barriers for controlling underfill material flow, in accordance with an embodiment of the present invention.

Figure 17:
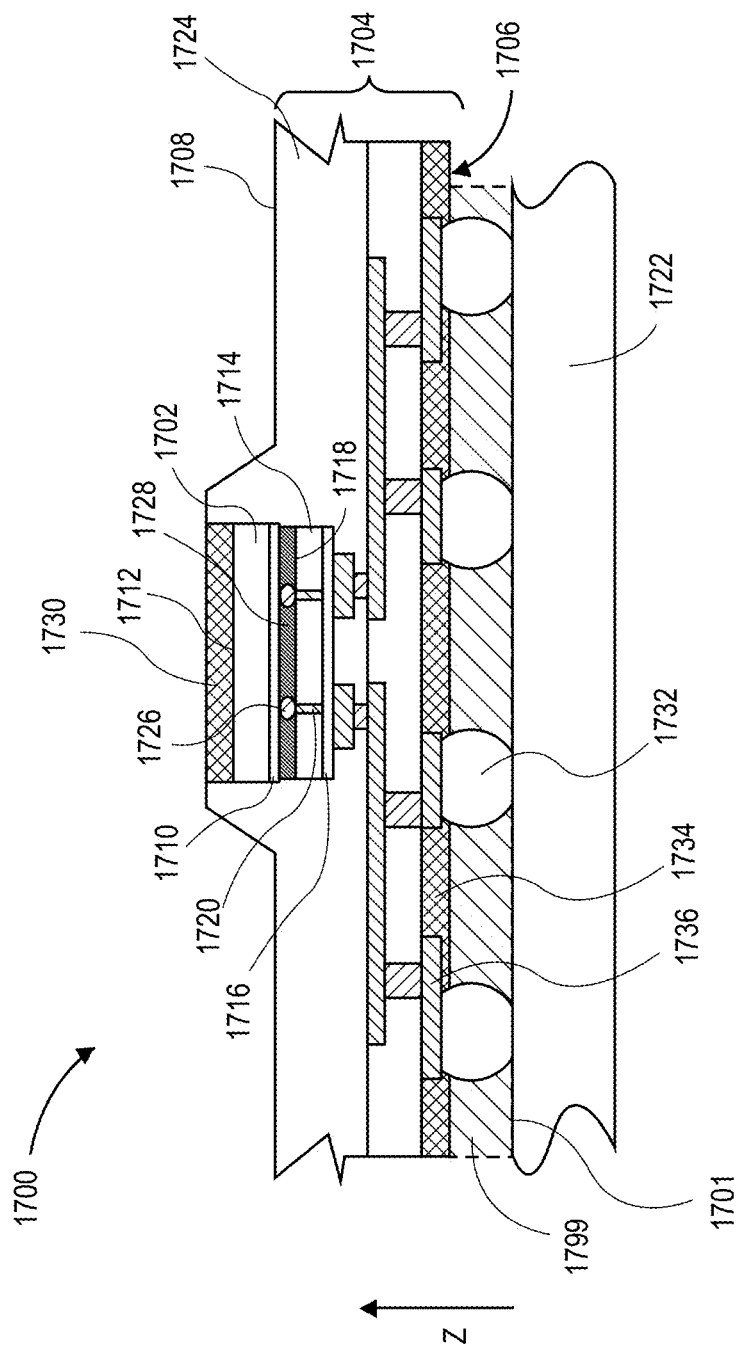
FIG. 17 illustrates a cross-sectional view of a coreless substrate with an embedded stacked through-silicon via die and including barriers for controlling underfill material flow, in accordance with an embodiment of the present invention.

Referring to FIG. 17, a stacked die apparatus 1700 includes a first die 1702 embedded in a coreless substrate 1704. The coreless substrate 1704 includes a land side 1706 and a die side 1708. The first die 1702 also includes an active surface, or device side, 1710 and a backside surface, or backside, 1712 and it can be seen that the active surface 1710 of the first die 1702 faces toward the land side 1706 while the backside 1712 faces in the same direction as the die side 1708 of coreless substrate 1704. The active surface may include a plurality of semiconductor devices, such as but not limited to transistors, capacitors and resistors interconnected together by a die interconnection structure into functional circuits to thereby form an integrated circuit.

As will be understood to those skilled in the art, the device side 1710 of first die 1702 includes an active portion with integrated circuitry and interconnections (not shown). The first die 1702 may be any appropriate integrated circuit device including but not limited to a microprocessor (single or multi-core), a memory device, a chipset, a graphics device, an application specific integrated circuit according to several different embodiments. In an embodiment, the stacked die apparatus 1700 also includes a die-bonding film 1730 disposed on the backside 1712 of the first die 1702.

In an embodiment, the first die 1702 is part of a larger apparatus that includes a second die 1714 that is disposed below the die side 1708 and that is coupled to the first die 1702. The second die 1714 is also illustrated with an active surface, or device side 1716 in simplified depiction, but it may also have metallization M1 to M11 or any number and top metallization thicknesses. Second die 1714 also has a backside surface, or backside, 1718.

Second die 1714 is also embedded in the coreless substrate 1704. In an embodiment, the second die 1714 has at least one through-silicon via 1720. Two through-silicon vias are depicted, one of which is enumerated, but the two illustrated through-silicon vias are presented for simplicity. In an embodiment, up to 1000 through-silicon vias are found in the second die 1714. The second die 1714 may therefore be referred to as a die including a through-silicon via disposed therein (TSV die 1714). The device side 1716 of the TSV die 1714 faces toward the land side 1706 while the backside 1718 faces toward the die side 1708 of coreless substrate 1704. As will be understood to those skilled in the art, the device side 1716 of the TSV die 1714 also includes an active portion with integrated circuitry and interconnections (not shown). The TSV die 1714 may be any appropriate integrated circuit device including but not limited to a microprocessor (single or multi-core), a memory device, a chipset, a graphics device, an application specific integrated circuit according to several different embodiments.

As depicted, the first die 1702 is coupled to the TSV die 1714 though the at least one through-silicon via 1720. In an embodiment, the first die 1702 is electrically coupled to the TSV die 1714 through the one or more through-silicon vias. In one embodiment, the first die 1702 is electrically coupled to the TSV die 1714 through the one or more through-silicon vias 1720 by one or more corresponding conductive bumps 1726 disposed on the first die 1702 and by one or more bond pads (not shown) disposed on the TSV die 1714. The bond pads are included on the backside 1718 of TSV die 1714 and in alignment with the one or more through-silicon vias 1720. In an embodiment, a layer of epoxy flux material 1728 is disposed between the first die 1702 and the TSV die 1714. In an embodiment, the coreless substrate 1704 is free from additional routing layers between the first die 1702 and the TSV die 1714. That is, in an embodiment, the first die 1702 and the TSV die 1714 communicate solely through conductive bumps on the device side 1710 of first die 1702 and the one or more through-silicon vias 1720 of TSV die 1714.

The TSV die 1714 is also illustrated with a metallization on device side 1718 in simplified form. The metallization is in contact with the integrated circuitry in the TSV die 1714 at the device side 1716. In an embodiment, the metallization has metal-one (M1) to metal-eleven (M11) metallization layers in order to pin out the complexity of the TSV die 1714 to the outside world, where M1 is in contact with the integrated circuitry in the TSV die 1714. In selected embodiments, any number of metallizations between M1 and M11 are present. In an example embodiment, the TSV die 1714 has metallizations from M1 to M7 and M7 is thicker than M1 to M6. Other metallization numbers and thickness combinations may be achieved depending upon a given application utility.

In an embodiment, as depicted in FIG. 17, stacked die apparatus 1700 includes a foundation substrate 1722 at the land side 1706 of coreless substrate 1704. For example, where the first die 1702 and TSV die 1714 are part of a hand-held device such as a smart phone embodiment or a hand-held reader embodiment, the foundation substrate 1722 is a motherboard. In an example embodiment, where the first die 1702 and TSV die 1714 are part of a hand-held device such as a smart phone embodiment or a hand-held reader embodiment, the foundation substrate 1722 is an external shell such as the portion an individual touches during use. In an example embodiment, where the first die 1702 and TSV die 1714 are part of a hand-held device such as a smart phone embodiment or a hand-held reader embodiment, the foundation substrate 1722 includes both the motherboard and an external shell such as the portion an individual touches during use. In an embodiment, coreless substrate 1704 is further coupled to the foundation substrate 1122 by an underfill material 1799 (e.g., an epoxy underfill material), as is also depicted in FIG. 17. In one such embodiment, regions 1701 for inclusion of barriers for controlling underfill material flow are provided in the foundation substrate 1722.

An array of external conductive contacts 1732 is disposed on the land side 1706 of the coreless substrate 1704. In an embodiment, the external conductive contacts 1732 couple the coreless substrate 1704 to the foundation substrate 1722. The external conductive contacts 1732 are used for electrical communication with the foundation substrate 1722. In one embodiment, the array of external conductive contacts 1732 is a ball grid array (BGA). A solder mask 1734 makes up the material that forms the land side 1706 of the coreless substrate 1704. The external conductive contacts 1732 are disposed upon bump bond pads 1736.

Figure 18:
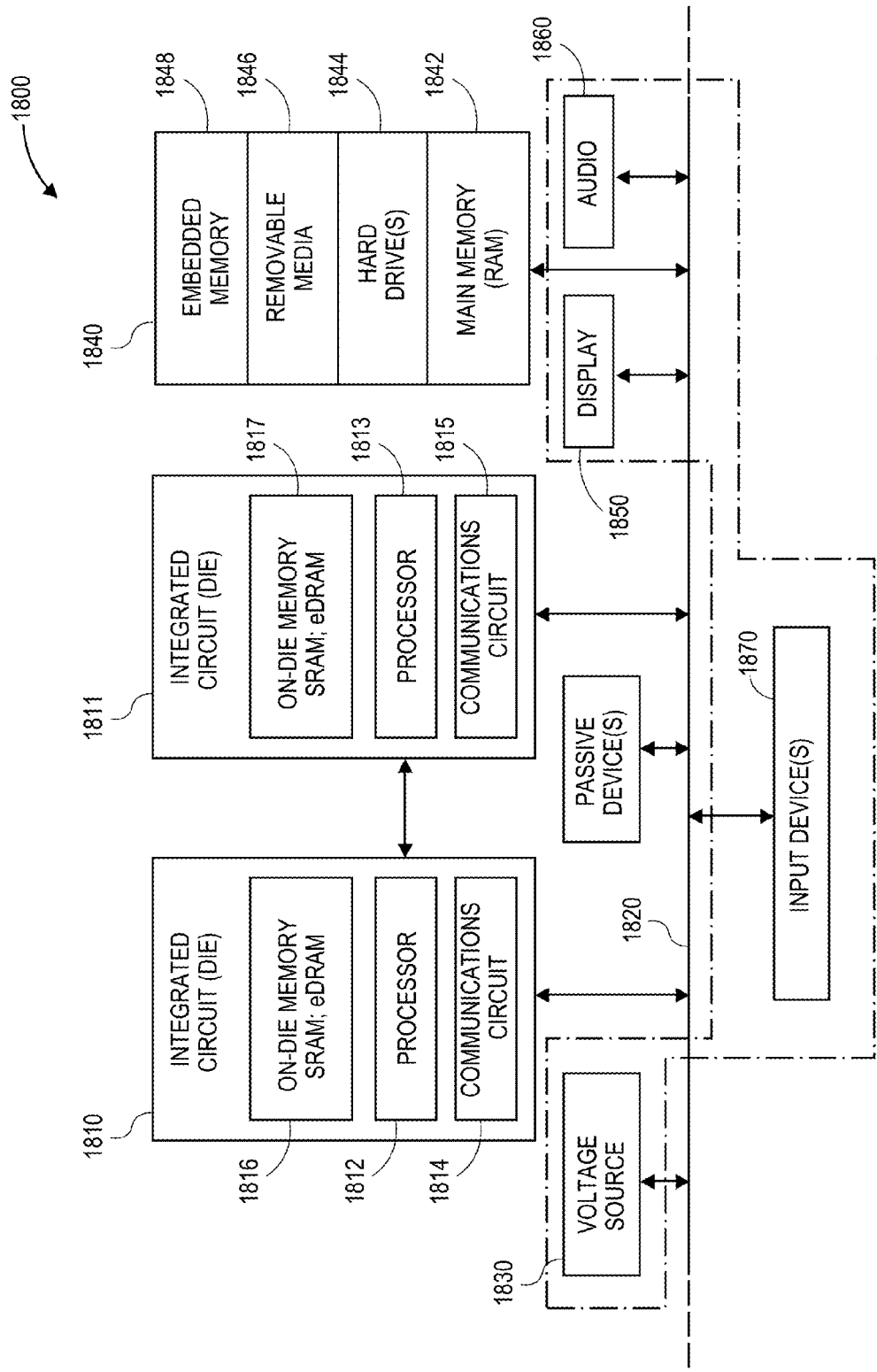
FIG. 18 is a schematic of a computer system, in accordance with an embodiment of the present invention.

FIG. 18 is a schematic of a computer system 1800, in accordance with an embodiment of the present invention. The computer system 1800 (also referred to as the electronic system 1800) as depicted can embody a package substrate having barriers for controlling underfill material flow according to any of the several disclosed embodiments and their equivalents as set forth in this disclosure. The computer system 1800 may be a mobile device such as a netbook computer. The computer system 1800 may be a mobile device such as a wireless smart phone. The computer system 1800 may be a desktop computer. The computer system 1800 may be a hand-held reader. The computer system 1800 may be a server system. The computer system 1800 may be a supercomputer or high-performance computing system.

In an embodiment, the electronic system 1800 is a computer system that includes a system bus 1820 to electrically couple the various components of the electronic system 1800. The system bus 1820 is a single bus or any combination of busses according to various embodiments. The electronic system 1800 includes a voltage source 1830 that provides power to the integrated circuit 1810. In some embodiments, the voltage source 1830 supplies current to the integrated circuit 1810 through the system bus 1820.

The integrated circuit 1810 is electrically coupled to the system bus 1820 and includes any circuit, or combination of circuits according to an embodiment. In an embodiment, the integrated circuit 1810 includes a processor 1812 that can be of any type. As used herein, the processor 1812 may mean any type of circuit such as, but not limited to, a microprocessor, a microcontroller, a graphics processor, a digital signal processor, or another processor. In an embodiment, the processor 1812 includes, or is coupled with, reliable microstrip routing for dense multi-chip-package interconnects, as disclosed herein. In an embodiment, SRAM embodiments are found in memory caches of the processor. Other types of circuits that can be included in the integrated circuit 1810 are a custom circuit or an application-specific integrated circuit (ASIC), such as a communications circuit 1814 for use in wireless devices such as cellular telephones, smart phones, pagers, portable computers, two-way radios, and similar electronic systems, or a communications circuit for servers. In an embodiment, the integrated circuit 1810 includes on-die memory 1816 such as static random-access memory (SRAM). In an embodiment, the integrated circuit 1810 includes embedded on-die memory 1816 such as embedded dynamic random-access memory (eDRAM).

In an embodiment, the integrated circuit 1810 is complemented with a subsequent integrated circuit 1811. Useful embodiments include a dual processor 1813 and a dual communications circuit 1815 and dual on-die memory 1817 such as SRAM. In an embodiment, the dual integrated circuit 1810 includes embedded on-die memory 1817 such as eDRAM.

In an embodiment, the electronic system 1800 also includes an external memory 1840 that in turn may include one or more memory elements suitable to the particular application, such as a main memory 1842 in the form of RAM, one or more hard drives 1844, and/or one or more drives that handle removable media 1846, such as diskettes, compact disks (CDs), digital variable disks (DVDs), flash memory drives, and other removable media known in the art. The external memory 1840 may also be embedded memory 1848 such as the first die in a die stack, according to an embodiment.

In an embodiment, the electronic system 1800 also includes a display device 1850, an audio output 1860. In an embodiment, the electronic system 1800 includes an input device such as a controller 1870 that may be a keyboard, mouse, trackball, game controller, microphone, voice-recognition device, or any other input device that inputs information into the electronic system 1800. In an embodiment, an input device 1870 is a camera. In an embodiment, an input device 1870 is a digital sound recorder. In an embodiment, an input device 1870 is a camera and a digital sound recorder.

As shown herein, the integrated circuit 1810 can be implemented in a number of different embodiments, including a package substrate having barriers for controlling underfill material flow according to any of the several disclosed embodiments and their equivalents, an electronic system, a computer system, one or more methods of fabricating an integrated circuit, and one or more methods of fabricating an electronic assembly that includes a package substrate having barriers for controlling underfill material flow according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having barriers for controlling underfill material flow embodiments and their equivalents. A foundation substrate may be included, as represented by the dashed line of FIG. 18. Passive devices may also be included, as is also depicted in FIG. 18.

Embodiments of the present invention include underfill material flow control for reduced die-to-die spacing in semiconductor packages and the resulting semiconductor packages.

In an embodiment, a semiconductor apparatus includes first and second semiconductor dies, each having a surface with an integrated circuit thereon coupled to contact pads of an uppermost metallization layer of a common semiconductor package substrate by a plurality of conductive contacts, the first and second semiconductor dies separated by a spacing. A barrier structure is disposed between the first semiconductor die and the common semiconductor package substrate and at least partially underneath the first semiconductor die. An underfill material layer is in contact with the second semiconductor die and with the barrier structure, but not in contact with the first semiconductor die.

In one embodiment, the barrier structure includes a plurality of copper traces disposed on an uppermost surface of the common semiconductor package substrate.

In one embodiment, the plurality of copper traces has a chevron pattern.

In one embodiment, the barrier structure includes a patterned ink structure disposed on an uppermost surface of the common semiconductor package substrate.

In one embodiment, the spacing separating the first and second semiconductor dies is approximately 100 microns.

In one embodiment, the first semiconductor die is a memory die, and the second semiconductor die is one such as, but not limited to, a microprocessor die or a system-on-chip (SoC) die.

In one embodiment, the barrier structure includes a plurality of slots to restrict flow of an underfill material used to form the underfill material layer.

In one embodiment, the first and second semiconductor dies are electrically coupled to one another by an embedded interconnection bridge (EmIB) disposed within the common semiconductor package substrate.

In an embodiment, a semiconductor package includes first and second adjacent semiconductor dies separated by a spacing. A silicon interposer structure is disposed below and electrically couples the first and second semiconductor dies. An organic package substrate is disposed below and electrically coupled to the silicon interposer structure. The organic package substrate includes a plurality of routing layers therein. A barrier structure is disposed between the first semiconductor die and the silicon interposer structure and at least partially underneath the first semiconductor die. An underfill material layer is in contact with the second semiconductor die and with the barrier structure, but not in contact with the first semiconductor die.

In one embodiment, the barrier structure includes a plurality of copper traces disposed on an uppermost surface of the silicon interposer structure.

In one embodiment, the plurality of copper traces has a chevron pattern.

In one embodiment, the barrier structure includes a patterned ink structure disposed on an uppermost surface of the silicon interposer structure.

In one embodiment, the spacing separating the first and second semiconductor dies is approximately 100 microns.

In one embodiment, the first semiconductor die is a memory die, and the second semiconductor die is one such as, but not limited to, a microprocessor die or a system-on-chip (SoC) die.

In one embodiment, the barrier structure includes a plurality of slots to restrict flow of an underfill material used to form the underfill material layer.

In one embodiment, the semiconductor package further includes a second barrier structure disposed between the organic package substrate and the silicon interposer structure.

In an embodiment, a bumpless build-up layer (BBUL) semiconductor apparatus includes a semiconductor die having a backside and a device side. A coreless substrate includes a land side and a die side, and the semiconductor die is embedded in the coreless substrate. The backside of the semiconductor die faces the die side of the coreless substrate, and the device side of the semiconductor die faces the land side of the coreless substrate. A foundation substrate is included. An array of external conductive contacts is disposed on the land side of the coreless substrate, electrically coupling the coreless substrate to the foundation substrate. A barrier structure is disposed between the semiconductor die and the foundation substrate proximate to the semiconductor die. An underfill material layer is disposed between the land side of the coreless substrate and the foundation substrate and surrounding the plurality of external conductive contacts, the underfill material layer in contact with the barrier structure.

In one embodiment, the barrier structure includes a plurality of copper traces disposed on an uppermost surface of the foundation substrate.

In one embodiment, the plurality of copper traces includes a chevron pattern.

In one embodiment, the barrier structure includes a patterned ink structure disposed on an uppermost surface of the foundation substrate.

In one embodiment, the barrier structure includes a plurality of slots to restrict flow of an underfill material used to form the underfill material layer.

What is claimed is:

1. A semiconductor apparatus, comprising:
   first and second semiconductor dies, each having a surface with an integrated circuit thereon coupled to contact pads of an uppermost metallization layer of a common semiconductor package substrate by a plurality of conductive contacts, the first and second semiconductor dies laterally adjacent to one another and separated by a spacing;
   a barrier structure disposed between the first semiconductor die and the common semiconductor package substrate and at least partially underneath the first semiconductor die; and
   an underfill material layer in contact with the second semiconductor die and with the barrier structure, but not in contact with the first semiconductor die, wherein the underfill material layer is disposed on and over an uppermost surface of the barrier structure at a location of a highest point of the uppermost surface of the barrier structure above the common semiconductor package substrate but is not on a portion of the uppermost surface of the barrier structure underneath the first semiconductor die.

2. The semiconductor apparatus of claim 1, wherein the barrier structure comprises a plurality of copper traces disposed on an uppermost surface of the common semiconductor package substrate.

3. The semiconductor apparatus of claim 2, wherein the plurality of copper traces comprises a chevron pattern.

4. The semiconductor apparatus of claim 1, wherein the barrier structure comprises a patterned ink structure disposed on an uppermost surface of the common semiconductor package substrate.

5. The semiconductor apparatus of claim 1, wherein the spacing separating the first and second semiconductor dies is approximately 100 microns.

6. The semiconductor apparatus of claim 1, wherein the first semiconductor die is a memory die, and the second semiconductor die is one selected from a microprocessor die and a system-on-chip (SoC) die.

7. The semiconductor apparatus of claim 1, wherein the barrier structure comprises a plurality of slots to restrict flow of an underfill material used to form the underfill material layer.

8. The semiconductor apparatus of claim 1, wherein the first and second semiconductor dies are electrically coupled to one another by an embedded interconnection bridge (EmIB) disposed within the common semiconductor package substrate.

9. The semiconductor apparatus of claim 1, wherein the barrier structure comprises a plurality of runaway traces for excess portions of the underfill material layer.

* * * * *